US009379029B2

(12) United States Patent
Osanai et al.

(10) Patent No.: US 9,379,029 B2
(45) Date of Patent: Jun. 28, 2016

(54) INSPECTION APPARATUS, INSPECTION SYSTEM, INSPECTION METHOD OF SEMICONDUCTOR DEVICES, AND MANUFACTURING METHOD OF INSPECTED SEMICONDUCTOR DEVICES

(75) Inventors: Yosuke Osanai, Toyota (JP); Takashi Ushijima, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 9 days.

(21) Appl. No.: 14/402,951

(22) PCT Filed: Jul. 18, 2012

(86) PCT No.: PCT/JP2012/068230
§ 371 (c)(1),
(2), (4) Date: Nov. 21, 2014

(87) PCT Pub. No.: WO2014/013571
PCT Pub. Date: Jan. 23, 2014

(65) Prior Publication Data
US 2015/0123694 A1     May 7, 2015

(51) Int. Cl.
*G01R 31/02*     (2006.01)
*H01L 21/66*     (2006.01)
*G01R 31/26*     (2014.01)
*G01R 31/28*     (2006.01)

(52) U.S. Cl.
CPC ............ *H01L 22/10* (2013.01); *G01R 31/2601* (2013.01); *G01R 31/2863* (2013.01); *H01L 22/14* (2013.01); *H01L 22/32* (2013.01)

(58) Field of Classification Search
CPC ........... G01R 31/2884; G01R 1/06766; G01R 31/31924; G01R 31/318572; G01R 31/31901; G01R 31/31926; G01R 31/2851; G01R 31/3004; G01R 31/2601; G01R 31/2625; G01R 31/2834; G01R 31/2879; G01R 31/311; G01R 31/31703; G01R 35/005
See application file for complete search history.

(56) References Cited

U.S. PATENT DOCUMENTS

| 7,256,604 | B1 | 8/2007 | Ota et al. |
| 2001/0030553 | A1 | 10/2001 | Aihara |
| 2005/0093561 | A1 | 5/2005 | Watanabe et al. |
| 2006/0238214 | A1 | 10/2006 | Itoh |
| 2009/0240365 | A1 | 9/2009 | Niijima et al. |
| 2011/0043233 | A1* | 2/2011 | Arkin ............... G01R 31/2889 324/755.03 |
| 2012/0262196 | A1* | 10/2012 | Yokou ............ G01R 31/318513 324/750.3 |

FOREIGN PATENT DOCUMENTS

| CN | 101026156 A | 8/2007 |
| JP | A-2-118470 | 5/1990 |

(Continued)

*Primary Examiner* — Tung X Nguyen
(74) *Attorney, Agent, or Firm* — Oliff PLC

(57) ABSTRACT

An inspection apparatus for inspecting output signal of a semiconductor device is provided with a monitor device configured to sense a signal on the monitor line and a plurality of inspection circuits connected to the monitor line. Each inspection circuit is provided with a semiconductor device support allowing a semiconductor device to be set thereon and including a signal terminal to which a signal is input from the set semiconductor device, a first resistor connected between the signal terminal and the monitor line, a selector terminal, and a first diode connected between the signal terminal and the selector terminal so that a cathode of the first diode is connected to a selector terminal side.

10 Claims, 13 Drawing Sheets

(56) References Cited

FOREIGN PATENT DOCUMENTS

| JP | H06-34719 A | 2/1994 |
| JP | 2001-296335 A | 10/2001 |
| JP | 2003-121500 A | 4/2003 |
| JP | A-2004-257921 | 9/2004 |
| JP | 2006-105738 A | 4/2006 |
| JP | A-2006-189340 | 7/2006 |
| JP | 2006-300842 A | 11/2006 |
| JP | A-2007-171114 | 7/2007 |
| JP | 2007-315789 A | 12/2007 |
| WO | 2008/044391 A1 | 4/2008 |

\* cited by examiner

INSPECTION APPARATUS, INSPECTION SYSTEM, INSPECTION METHOD OF SEMICONDUCTOR DEVICES, AND MANUFACTURING METHOD OF INSPECTED SEMICONDUCTOR DEVICES

TECHNICAL FIELD

The technology disclosed in the present specification relates to a semiconductor device.

BACKGROUND ART

Japanese Patent Application Publication No. 2004-257921 (hereinafter, referred to as Patent Literature 1) discloses a burn-in inspection method for a semiconductor device. In an inspection apparatus used in this inspection method, a plurality of semiconductor devices is connected to a common ammeter. In this inspection method, a signal input to each semiconductor device is controlled so that only a singly-selected semiconductor device is turned on and the other semiconductor devices are not turned on. Thus, an energizing current of the selected semiconductor device is sensed by the ammeter and it is tested as to whether the selected semiconductor device operates appropriately or not. After an inspection of the single semiconductor device is finished, another semiconductor device is selected for next inspection. Thus, all the semiconductor devices are inspected.

SUMMARY OF INVENTION

Technical Problem

In the inspection method of Patent Literature 1, the inspection cannot be performed appropriately if a semiconductor device with conduction failure is included in the plurality of semiconductor devices to be inspected. It should be noted that the semiconductor device with the conduction failure as herein mentioned, is a semiconductor device that is turned on (i.e. conducted) even when a signal for not turning it on is input thereto. That is, if the semiconductor device with the conduction failure is included, an unselected semiconductor device with the conduction failure is also turned on during the inspection of the selected semiconductor device. Then, an energizing current of the semiconductor device with the conduction failure flows in the ammeter in addition to the energizing current of the selected semiconductor device. Therefore, the energizing current of the selected semiconductor device cannot be sensed and accordingly the inspection cannot be performed accurately.

Solution to Technical Problem

The inspection apparatus disclosed in the present specification is configured to inspect output signal of a semiconductor device. The inspection apparatus comprises a monitor line, a monitor device configured to sense a signal on the monitor line, and a plurality of inspection circuits connected to the monitor line. Each inspection circuit comprises: a semiconductor device support on which a semiconductor device is to be set the semiconductor device support comprising a signal terminal to which a signal is input from the semiconductor device set on the semiconductor support; a first resistor connected between the signal terminal and the monitor line; a selector terminal; and a first diode connected between the signal terminal and the selector terminal so that a cathode of the first diode is connected to a selector terminal side.

FIG. 1 illustrates one embodiment of the above-described inspection apparatus as an example. In FIG. 1, a reference number 100 indicates a monitor device, a reference number 102 indicates a monitor line and a reference number 104 indicates an inspection circuit. It should be noted that, although two inspection circuits 104a and 104b are illustrated in FIG. 1, two or more inspection circuits may be connected to the monitor line. Moreover, a reference number 110 indicates a semiconductor device support, a reference number 112 indicates a semiconductor device, a reference number 114 indicates a first resistor, a reference number 116 indicates a first diode, a reference number 118 indicates a selector terminal and a reference number 120 indicates a signal terminal.

When the inspection is performed using this inspection apparatus, a single semiconductor device is selected among semiconductor devices set on the inspection apparatus and a first potential is applied on a selector terminal of an inspection circuit comprising the selected semiconductor device. A second potential lower than the first potential is applied on selector terminals of other inspection circuits. For example, when a semiconductor device 112a is selected in FIG. 1, a first potential V1 is applied on a selector terminal 118a while a second potential V2 is applied on a selector terminal 118b. When the first potential V1 is applied on the selector terminal 118a, a first diode 116a is not turned on. Thus, signal output from the semiconductor device 112a to a signal terminal 120a is output onto the monitor line 102. By contrast, in a state where the second potential V2 is applied on the selector terminal 118b, a first diode 116b is turned on when the potential of a signal terminal 120b is increased. This prevents an increase of the potential of the signal terminal 120b. Thus, signal from an unselected semiconductor device 112b is prevented from being output onto the monitor line 102. Therefore, the monitor device 100 can accurately sense output signal of the selected semiconductor device 112a. Thus, this inspection apparatus can accurately inspect each semiconductor device.

Furthermore, the present specification provides an inspection method for inspecting output signals of semiconductor devices using an inspection apparatus. The inspection apparatus comprises a monitor line and a plurality of inspection circuits connected to the monitor line. Each inspection circuit comprises: a semiconductor device support on which a semiconductor device is to be set, the semiconductor device support comprising a signal terminal to which a signal is input from the semiconductor device set on the semiconductor support; a first resistor connected between the signal terminal and the monitor line; a selector terminal; and a first diode connected between the signal terminal and the selector terminal so that a cathode of the first diode is connected to a selector terminal side. The inspection method comprises: setting a semiconductor device on each semiconductor device support; sensing a signal on the monitor line in a state where a first potential is applied on a first selector terminal among the plurality of the selector terminals and a second potential lower than the first potential is applied on other selector terminals; and sensing the signal on the monitor line in a state where the first potential is applied on a second selector terminal among the plurality of the selector terminals and the second potential is applied on other selector terminals.

In addition, the present description provides a method for manufacturing inspected semiconductor devices. The manufacturing method comprises: forming structures of semiconductor devices and inspecting the formed semiconductor devices. An inspection apparatus used in the inspection comprises a monitor line and a plurality of inspection circuits connected to the monitor line. Each inspection circuit comprises: a semiconductor device support on which a semiconductor device is to be set, the semiconductor device support comprising a signal terminal to which a signal is input from the semiconductor device set on the semiconductor support; a first resistor connected between the signal terminal and the monitor line; a selector terminal; and a first diode connected between the signal terminal and the selector terminal so that a cathode of the first diode is connected to a selector terminal side. The inspection comprises: setting a semiconductor device on each semiconductor device support; sensing a signal on the monitor line in a state where a first potential is applied on a first selector terminal among the plurality of the selector terminals and a second potential lower than the first potential is applied on other selector terminals; and sensing the signal on the monitor line in a state where the first potential is applied on a second selector terminal among the plurality of the selector terminals and the second potential is applied on other selector terminals.

DESCRIPTION OF EMBODIMENTS

First, preferred features of below embodiments will be listed hereinbelow. It should be noted that any of the features listed herein is effective independently.

(Feature 1) There may further be provided a selector device configured to perform an operation to apply a first potential on a first selector terminal among a plurality of selector terminals and apply a second potential lower than the first potential on other selector terminals and an operation to apply the first potential on a second selector terminal among the plurality of the selector terminals and apply the second potential on other selector terminals.

(Feature 2) A relationship of V1>VH1−VF11 may be satisfied, in which V1 is the first potential, VH1 is an upper potential of a signal input to a signal terminal corresponding to the selector terminal on which the first potential is applied and VF11 is a forward voltage of a first diode corresponding to the selector terminal on which the first potential is applied. A relationship of V2<VH2−VF12 is satisfied, in which V2 is the second potential, VH2 is an upper potential of the signal input to the signal terminal corresponding to the selector terminal on which the second potential is applied and VF12 is a forward voltage of a second diode corresponding to the selector terminal on which the second potential is applied.

It should be noted that the forward voltage of the diode means a voltage generated between an anode and a cathode of the diode when a rated current is made to flow in the diode. Moreover, the upper potential of the signal means a potential of a highest potential state among a plurality of possible potential states of the signal. Furthermore, in the following, the lower potential of the signal means a potential of a lowest potential state among the plurality of possible potential states of the signal. Therefore, regarding the signal shifting between a high potential and a low potential, for example, the high potential is the upper potential and the low potential is the lower potential. In addition, there also exists a semiconductor device configured to output the signal shifting among the high potential, the low potential and an open potential (a potential in a state disconnected from other terminals in the semiconductor device). Since an electrode of the open potential is in a floating state the potential thereof is determined depending on a surrounding environment. In general, the open potential is lower than the high potential and higher than the low potential. Also in this case, the high potential is the upper potential and the low potential is the lower potential. Moreover, regarding the signal shifting between the high potential and the open potential, the high potential is the upper potential and the open potential is the lower potential. Furthermore, regarding the signal shifting between the open potential and the low potential, the open potential is the upper potential and the low potential is the lower potential.

Figure 1:
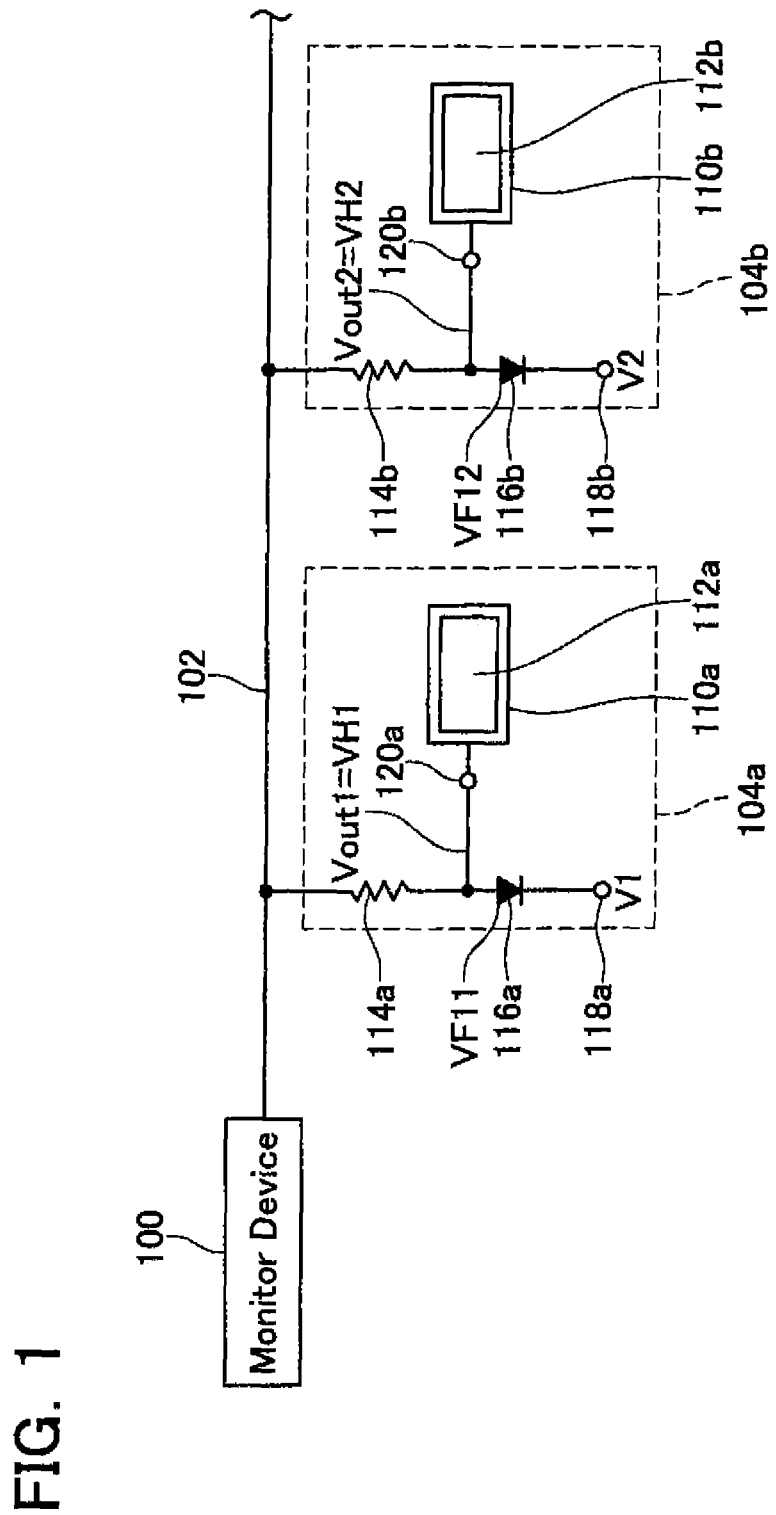
FIG. 1 is an example of a circuit diagram of an inspection system of an embodiment.

In a case of FIG. 1 (in a case where a semiconductor device 112a is selected), a condition for not turning on a first diode 116a is V1>Vout1−VF11 (Vout1 is a potential of a signal terminal 120a). The potential Vout1 does not become higher than the upper potential VH1 in principle. Therefore, when V1>VH1−VF11 is satisfied, it is possible that the first diode 116a is constantly kept off during an inspection of the selected semiconductor device 112a. On the other hand, in the case of FIG. 1, a condition for turning on a second diode 116b is V2<Vout2−VF12 (Vout2 is a potential of a signal terminal 120b). Therefore, as long as V2<VH2−VF12 is satisfied, even if an unselected semiconductor device 112b outputs the upper potential VH2, the diode 116b is turned on when the upper potential VH2 is output. Thus, the upper potential VH2 can be prevented from being output onto a monitor line.

(Feature 3) Each inspection circuit may comprise the second diode connected in parallel to a first resistor so that a cathode of the second diode is connected to a monitor line side.

Figure 2:
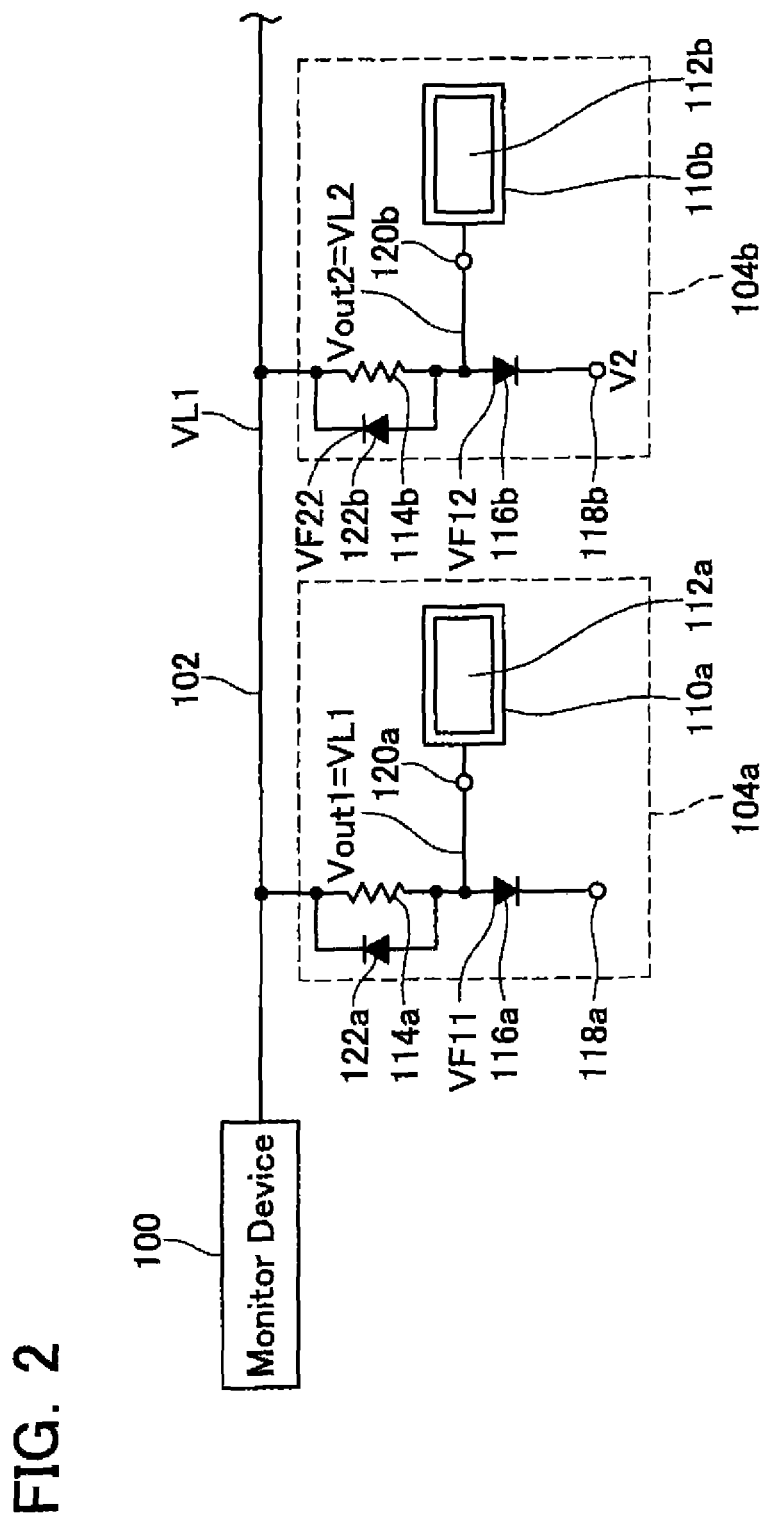
FIG. 2 is an example of a circuit diagram of an inspection system of another embodiment.

FIG. 2 illustrates one embodiment of a configuration of Feature 3. It should be noted that, in FIG. 2, second diodes 122 are added to FIG. 1. According to this configuration, when output signal from the selected semiconductor device 112a is the upper potential, a diode 122a is turned on. Thus, the signal is transmitted from the semiconductor device 112a to the monitor line. According to this configuration, it is possible to increase the potential of the monitor line 102 when the output signal from the semiconductor device 112a has the upper potential, because the signal is transmitted to the monitor line 102 via the first resistor 114a and the diode 122a, as compared with the case where the signal is transmitted to the monitor line 102 via only the first resistor 114a. Therefore, an SN ratio of the signal on the monitor line 102 can be increased.

(Feature 4) A relationship of V2+VF12<VL1+VF22 may be satisfied, in which VL1 is a lower potential of the signal input to the signal terminal corresponding to the selector terminal on which the first potential is applied, V2 is the second potential, VF12 is a forward voltage of the first diode corresponding to the selector terminal on which the second potential is applied, and VF22 is a forward voltage of the second diode corresponding to the selector terminal on which the second potential is applied.

As illustrated in FIG. 2, when the selected semiconductor device 112a outputs the lower potential VL1, the potential of the monitor line 102 becomes substantially equal to the lower potential VL1. As long as the above-described relationship is satisfied, even if the unselected semiconductor device 112b outputs the potential VL2 to the signal terminal 120b, the first diode 116b is turned on earlier than the second diode 122b. Thus, according to this feature, even when the semiconductor device 112b outputs a high potential, the high potential can be prevented from being output to the monitor line 102 via the second diode 122b.

(Feature 5) Each inspection circuit may comprise a second resistor connected between the signal terminal and a connection portion connecting an anode of the first diode and the first resistor.

According to this configuration, overcurrent can be prevented from flowing into the unselected semiconductor device and the first diode.

(Feature 6) Each semiconductor device support may comprise a high potential terminal providing a high potential to the semiconductor device set on the semiconductor device support and a low potential terminal providing a low potential to the semiconductor device set on the semiconductor device support. Each of a plurality of inspection circuits may comprise a third resistor connected between the high potential terminal and the signal terminal.

According to this configuration, it is possible to inspect semiconductor devices configured to output the open potential and the low potential more accurately.

(Feature 7) Each semiconductor device support may comprise a high potential terminal providing a high potential to the semiconductor device set on the semiconductor device support and a low potential terminal providing a low potential to the semiconductor device set on the semiconductor device support. Each inspection circuit may comprise a fourth resistor connected between the low potential terminal and the signal terminal.

According to such a configuration, it is possible to inspect semiconductor devices configured to output the open potential and the high potential more accurately.

(Feature 8) An inspection system may comprise a plurality of any of the above-described inspection apparatuses. The monitor line and the monitor device of each inspection apparatus are independent and the selector terminal of each inspection apparatus is common with the selector terminals of other inspection apparatuses.

According to this inspection system, it is possible to inspect a number of semiconductor devices for short time.

Embodiments

Figure 3:
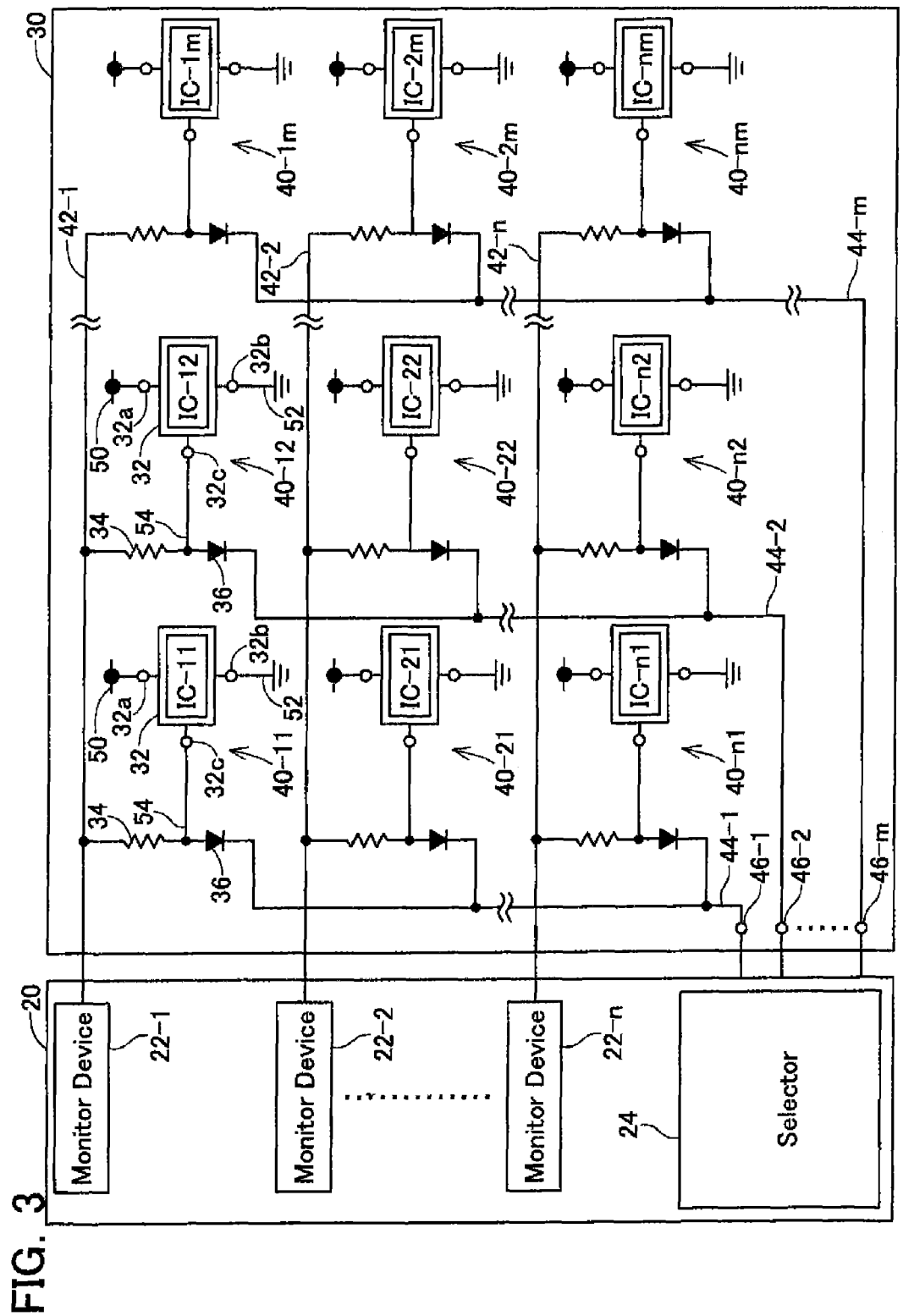
FIG. 3 is a circuit diagram of an inspection system 10 of an embodiment.

A burn-in inspection system 10 illustrated in FIG. 3 operates ICs under a high-temperature environment and inspects output signals of the ICs. The burn-in inspection system 10 comprises a control unit 20 and a burn-in board 30.

Monitor lines 42 extended in a lateral direction of FIG. 3 are formed on a substrate of the burn-in board 30. n-sets of the monitor lines 42 are arranged in a vertical direction in FIG. 3. In the following, the monitor line 42 existing in a row "j" is represented as the monitor line 42-$j$ (j is an arbitrary integer; $1 \leq j \leq n$).

Selector lines 44 extended in the vertical direction of FIG. 3 are formed on the substrate of the burn-in board 30. m-sets of the selector lines 44 are arranged in the lateral direction in FIG. 3. In the following, the selector line 44 existing in a column "k" is represented as the selector line 44-$k$ (k is an arbitrary integer; $1 \leq k \leq m$). Selector terminals 46 are formed at ends of the selector lines 44. That is, m-pieces of the selector terminals 46 exist. In the following, the selector terminal 46 connected to the selector line 44-$k$ is represented as the selector terminal 46-$k$.

Many inspection circuits 40 are formed on the substrate of the burn-in board 30. The m-sets of the inspection circuits 40 are arranged in the lateral direction in FIG. 3 and the n-sets of the inspection circuits 40 are arranged in the vertical direction in FIG. 3. That is, m×n-sets of the inspection circuits 40 are formed on the substrate of the burn-in board 30. In the following, the inspection circuit 40 existing in the row "j" and the column "k" may be represented as the inspection circuit 40-$jk$. Moreover, each component of the inspection circuit 40 may be represented in the same manner. The inspection circuit 40-$jk$ is connected to the monitor line 42-$j$ and the selector line 44-$k$.

Each inspection circuit 40 comprises an IC socket 32, a resistor 34 and a diode 36. It should be noted that, in each diagram explaining the embodiment, reference numbers of the IC sockets, the resistors and the diodes are given only to the inspection circuit 40-11 and the inspection circuit 40-12 in order to improve visibility of the diagram. Configurations of the inspection circuits 40 are the same and thus the configuration of the single inspection circuit 40 alone will be described as follows. An IC is attached to the IC socket 32 of the inspection circuit 40. The IC socket 32 comprises a number of terminals. For example, the IC socket 32 comprises a terminal 32a connected to power supply wiring 50 and a terminal 32b connected to a ground wiring 52. Through these terminals, a power supply potential Vcc and a ground potential V0 are supplied to the IC set on the IC socket 32. Moreover, the IC socket 32 comprises a signal terminal 32c connected to output wiring 54. A signal is input to the signal terminal 32c from the IC set on the IC socket 32. The signal shifts between the power supply potential Vcc and the ground potential V0. Furthermore, the IC set on the IC socket 32 is controlled by a control signal input from a terminal not illustrated. The resistor 34 is connected between the output wiring 54 and the monitor line 42. The diode 36 is connected between the output wiring 54 and the selector line 44. The diode 36 is connected so that a cathode of the diode 36 is connected to a side of the selector line 44.

The control unit 20 comprises n-units of monitor devices 22. Each monitor device 22 is connected to the corresponding monitor line 42. In the following, the monitor device 22 connected to a monitor line 42-$j$ is represented as the monitor device 22-$j$. The monitor device 22-$j$ senses a signal (a potential) on the monitor line 42-$j$.

The control unit 20 comprises a selector device 24. The selector device 24 controls potentials of m-pieces of the selector terminals 46-1 to 46-$m$.

The burn-in inspection system 10 is used in an IC manufacturing line. In the following, a method for manufacturing ICs will be described. The method for manufacturing the ICs comprises a step for forming structures of the ICs and a step for inspecting the ICs. In the step for forming the structures of the ICs, a semiconductor circuit is first formed in a semiconductor wafer by ion implantation or the like. Next, the semiconductor wafer is divided into semiconductor chips by dicing. Then, the semiconductor chip is fixed on a lead frame and the semiconductor chip and the lead frame are connected by wire bonding or the like. Thereafter, the semiconductor chip is resin-molded together with the lead frame. Thus, the IC before inspection is obtained.

Next, the step for inspecting the ICs will be described. In the step for inspecting the ICs, the ICs are inspected using the above-described inspection system 10. First, the IC is arranged on each IC socket 32 of the inspection system 10. Here, the m×n pieces of the ICs are arranged in the inspection system 10. In the following, the IC set on a socket 32-*jk* is referred to as an IC-*jk*. Next, the burn-in board 30 is heated to a prescribed temperature. Each IC is inspected in a state where the burn-in board 30 is heated.

Figure 4:
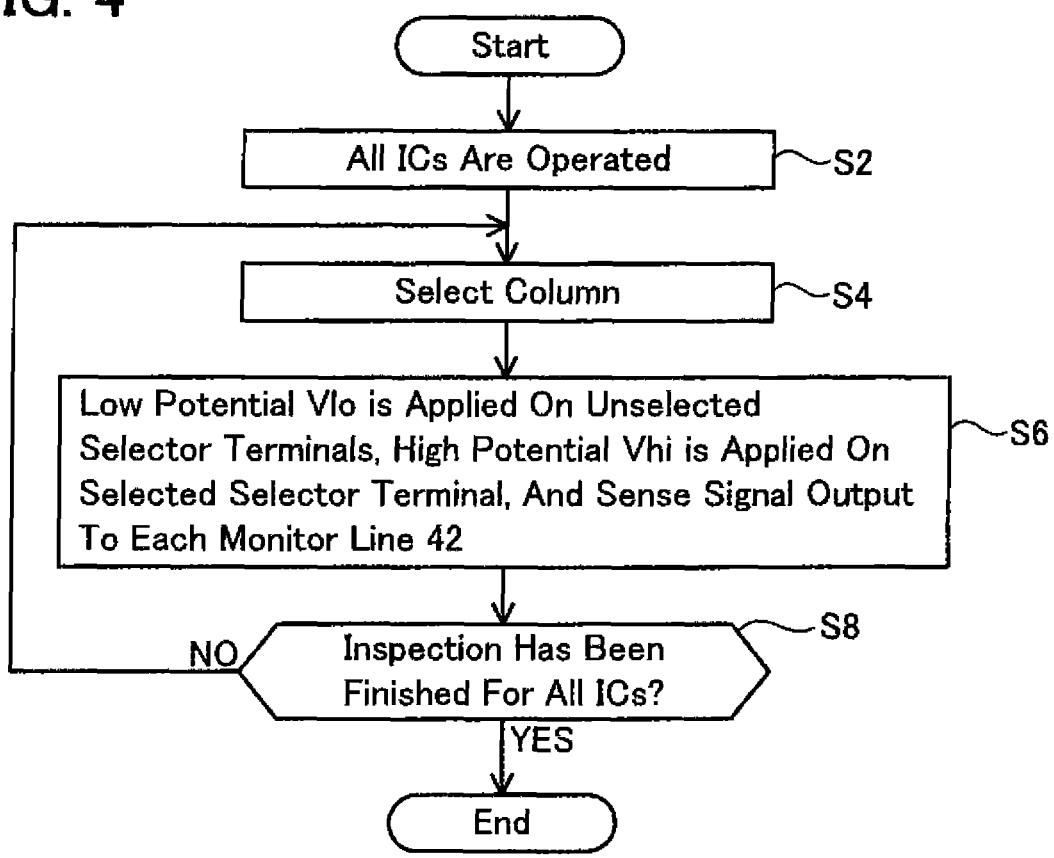
FIG. 4 is a flowchart illustrating processing performed by the inspection system 10 of the embodiment.

Next, the control unit 20 performs processing of FIG. 4. At Step S2, all the ICs are operated. Thus, signal is output to the signal terminal 32*c* of each IC socket 32. Each of subsequent steps is performed in a state where each of the ICs is operating.

At Step S4, the selector device 24 selects a column to be inspected. In Step S4 carried out for the first time, a first column (that is, IC-11 to IC-n1) is selected.

In Step S6, the selector device 24 first applies a low potential Vlo on the selector terminals 46 corresponding to unselected columns. Moreover, the selector device 24 applies a high potential Vhi on the selector terminal 46 corresponding to a selected column. Then, each monitor device 22 senses a signal of the corresponding monitor line 42. Since the first column is selected in the first Step S4, in a first Step S6, the high potential Vhi is applied on the selector terminal 46-1 and the low potential Vlo is applied on the selector terminals 46-2 to 46-*m*. An operation of each of the inspection circuits 40-11 to 40-1*m* connected to the monitor line 42-1, in this case, will be described.

In the inspection circuit 40-12, the low potential Vlo is applied on the selector line 44-2. In this embodiment, the low potential Vlo is substantially equal to the ground potential V0. Thus, the low potential Vlo, the upper potential Vcc (that is, the power supply potential Vcc) of a signal output by the IC-12 and a forward voltage VF36 of the diode 36-12 satisfy a relationship of Vlo<Vcc−VF36. Therefore, when the output potential of the IC-12 (that is, the potential of the signal terminal 32*c*) is about to increase, the diode 36-12 is turned on. Then, the potential of the signal terminal 32*c* is almost fixed to the potential V0 in the inspection circuit 40-12. Consequently, the signals are not transmitted onto the monitor line 42-1 from the IC-12. Moreover, the inspection circuits 40-13 to 40-1*m* also operate similarly to the inspection circuit 40-12 (it should be noted that, in this example, the upper potentials Vcc of output signals of all the ICs are substantially equal to each other and the forward voltages VF36 of all the diodes 36 are substantially equal to each other). Therefore, the signals are not transmitted onto the monitor line 42-1 also from the inspection circuits 40-13 to 40-1*m*.

On the other hand, in the inspection circuit 40-11, the high potential Vhi is applied on the selector line 44-1. In this example, the high potential Vhi is substantially equal to the power supply potential Vcc. Thus, the high potential Vhi, the upper potential Vcc of a signal output by the IC-11 and the forward voltage VF36 of the diode 36-11 satisfy a relationship of Vhi>Vcc−VF36. Therefore, the diode 36-11 is not turned on and the signals output by the IC-11 are output onto the monitor line 42-1 via the resistor 34-11. Consequently, the monitor device 22-1 senses the signal of the IC-11.

Figure 5:
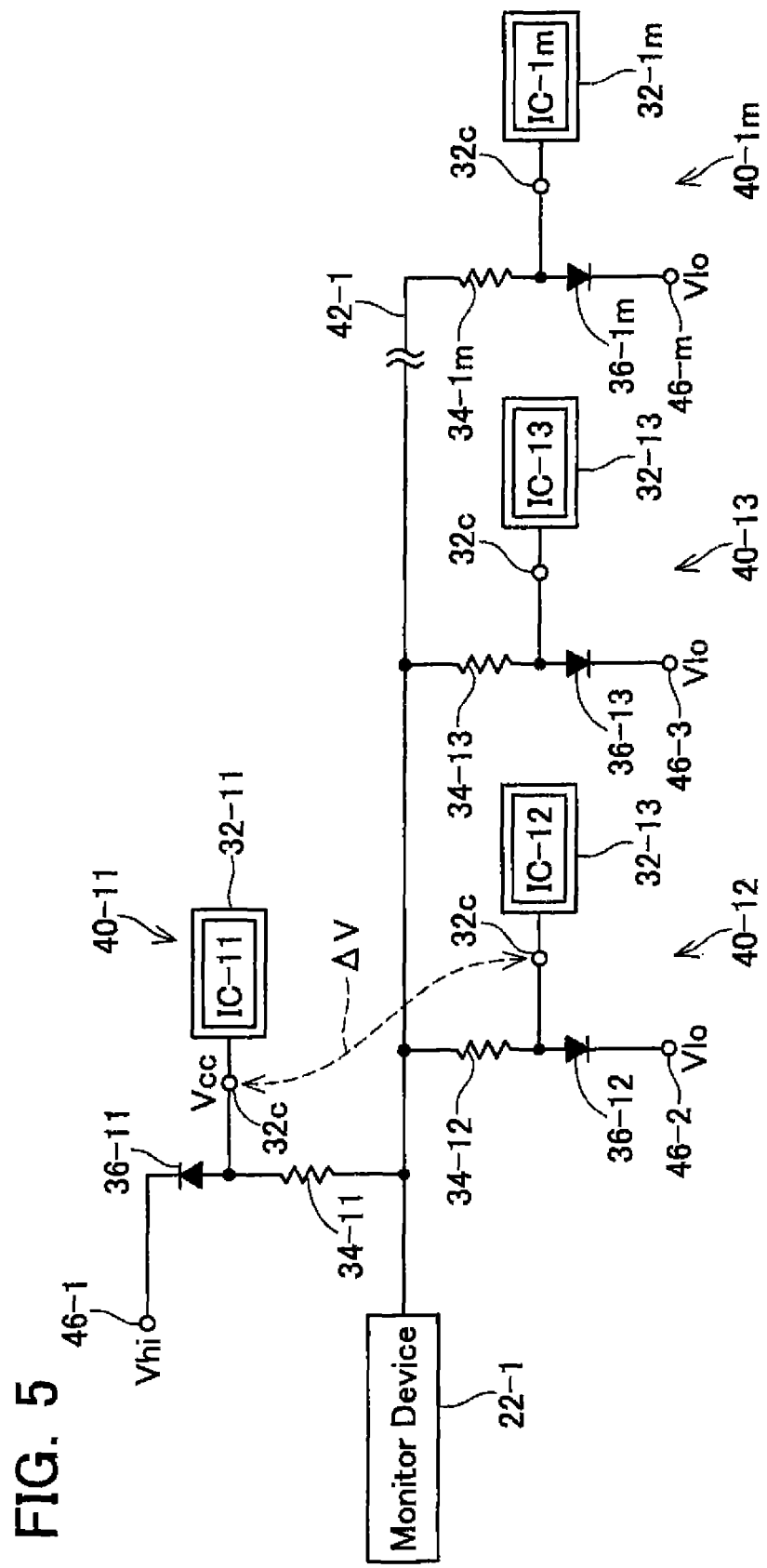
FIG. 5 is an equivalent circuit diagram of a first row part of the inspection system 10 of the embodiment.

It should be noted that FIG. 5 illustrates an equivalent circuit of each of the inspection circuits 40-11 to 40-1*m* connected to the monitor line 42-1. Since the diodes 36-12 to 36-1*m* are on, when the IC-11 outputs the potential Vcc to the signal terminals 32*c*, a potential difference ΔV between the signal terminal 32*c* of the IC-11 and the signal terminals 32*c* of other IC-12 to IC-1m (see FIG. 5) is Vcc−(VF36+Vlo). Thus, the voltage applied on each of the resistors 34-12 to 34-1*m* is a value obtained by dividing the potential difference ΔV by a combined resistance value RN of the resistors 34-12 to 34-1*m* and a resistance value R11 of the resistor 34-11, which is ΔV·RN/(RN+R11). Therefore, a potential VM1 of the monitor line 42-1 when the IC-11 outputs the potential Vcc to the signal terminal 32*c* is:

$$VM1 = \{Vcc - (VF36 + Vlo)\} \frac{RN}{RN + R11} + VF36 + Vlo, \quad \text{[Formula 1]}$$

in which the following formulation is satisfied:

$$\frac{1}{RN} = \frac{1}{R12} + \frac{1}{R13} + \cdots \frac{1}{R1m}$$

It should be noted that the potential Vlo is substantially equal to the ground V0 (that is, 0V) as mentioned above and thus the above Formula 1 can be also expressed as follows:

$$VM1 = (Vcc - VF36) \frac{RN}{RN + R11} + VF36 \quad \text{[Formula 2]}$$

On the other hand, a potential VM2 of the monitor line 42-1 of when the IC-11 outputs the potential V0 to the signal terminal 32*c* is substantially equal to the potential V0.

Therefore, the monitor device 22-1 senses a signal shifting between the above-described VM1 and VM2. The monitor device 22-1 determine whether the IC-11 is normal or not by comparing the sensed signal with an expected value.

Moreover, each of the inspection circuits 40 connected to the other monitor lines 42-2 to 42-*n* operates similarly to each of the inspection circuits 40 connected to the monitor line 42-1. Therefore, the monitor devices 22-2 to 22-*n* sense the signals of the IC-21 to IC-n1 to determine a quality of each of the IC-21 to IC-n1.

When Step S6 is finished, it is determined as to whether the inspection has been finished for all the ICs (Step S8). When the inspection has not been finished, the processing from Step S4 is repeated again. At a next Step S4, a column following the column selected in the previous time is selected. Thus, the inspection is performed until the ICs of the last column m by repeating Steps S4 to S8. When the inspection of all the ICs is finished, the inspection system 10 finishes the processing.

The manufacture of each IC is complete such that the ICs are ready to be shipped after the above-mentioned inspection process is finished.

As mentioned above, the signals can be prevented from being output to the monitor line 42 from the ICs of unselected columns in the inspection system 10. Therefore, it is possible to accurately inspect the selected ICs. Moreover, since the signals are not output to the monitor line 42 from the ICs of the unselected columns, it is possible to inspect the ICs of the selected column while the ICs of the unselected columns continue to operate. Furthermore, even when the IC in the unselected column has a failure or the like, an inspection result of the ICs of the selected column is not affected. For example, even when the unselected IC is about to output an abnormal potential to the signal terminal 32c due to the failure or the like, the potential of the signal terminal 32c does not increase. Therefore, it is possible to accurately inspect the selected ICs.

Moreover, each inspection circuit 40 belonging to the selected column is connected to the different monitor line 42 in the above inspection system 10. Therefore, it is possible to inspect a plurality of the ICs at once.

Next, inspection systems according to other embodiments are described. Some ICs are configured to output an open potential. An inspection of the ICs configured to output the open potential can be performed as well in the above-described embodiment. However, since the open potential is an unstable potential which varies depending on the surrounding environment, the inspection accuracy is decreased. Therefore, other embodiments in which the ICs configured to output the open potential can be inspected suitably, will be described hereinbelow.

Figure 6:
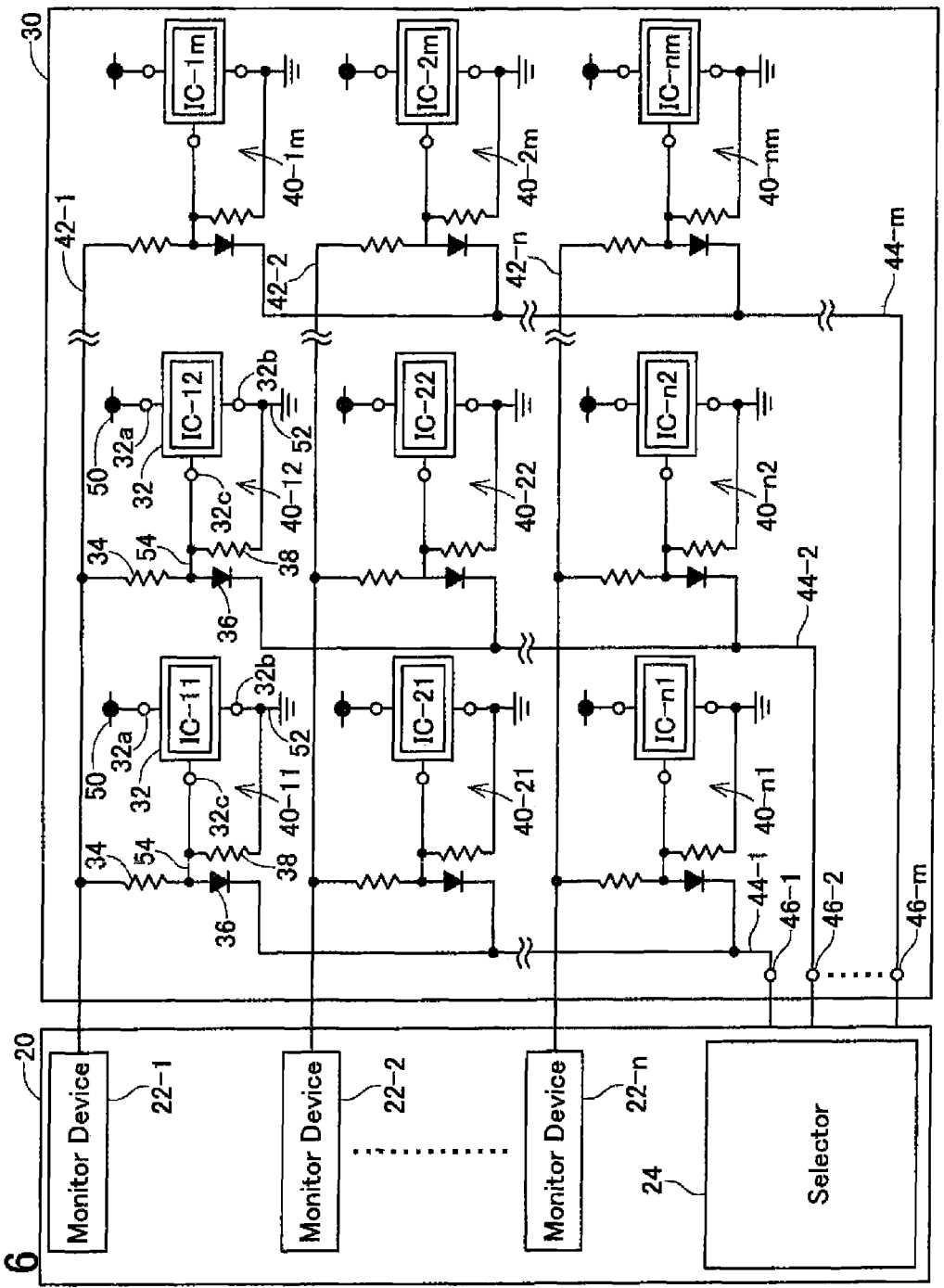
FIG. 6 is a circuit diagram of an inspection system of another embodiment.

FIG. 6 is an embodiment suitable for the ICs configured to output the open potential and the power supply potential Vcc. In the embodiment of FIG. 6, a resistor 38 connecting the signal terminal 32c and the ground wiring 52 is added to each inspection circuit 40, as compared with FIG. 3. In this embodiment, when a selected IC inputs the power supply potential Vcc to the signal terminal 32c, the potential is output to the monitor line 42, similarly to the above-described embodiment. When the selected IC outputs the open potential to the signal terminal 32c, the signal terminal 32c has the ground potential V0 because the signal terminal 32c is connected to the ground wiring 52 via the resistor 38. Therefore, also in this case, the potential of the monitor line 42 becomes the ground potential V0, similarly to the above-described embodiment. In this manner, even when the IC outputs the open potential, the potential of the signal terminal 32c is fixed to the ground potential V0 such that the monitor device 22 can sense a clearer signal. Therefore, it is possible to perform the inspection more accurately.

Figure 7:
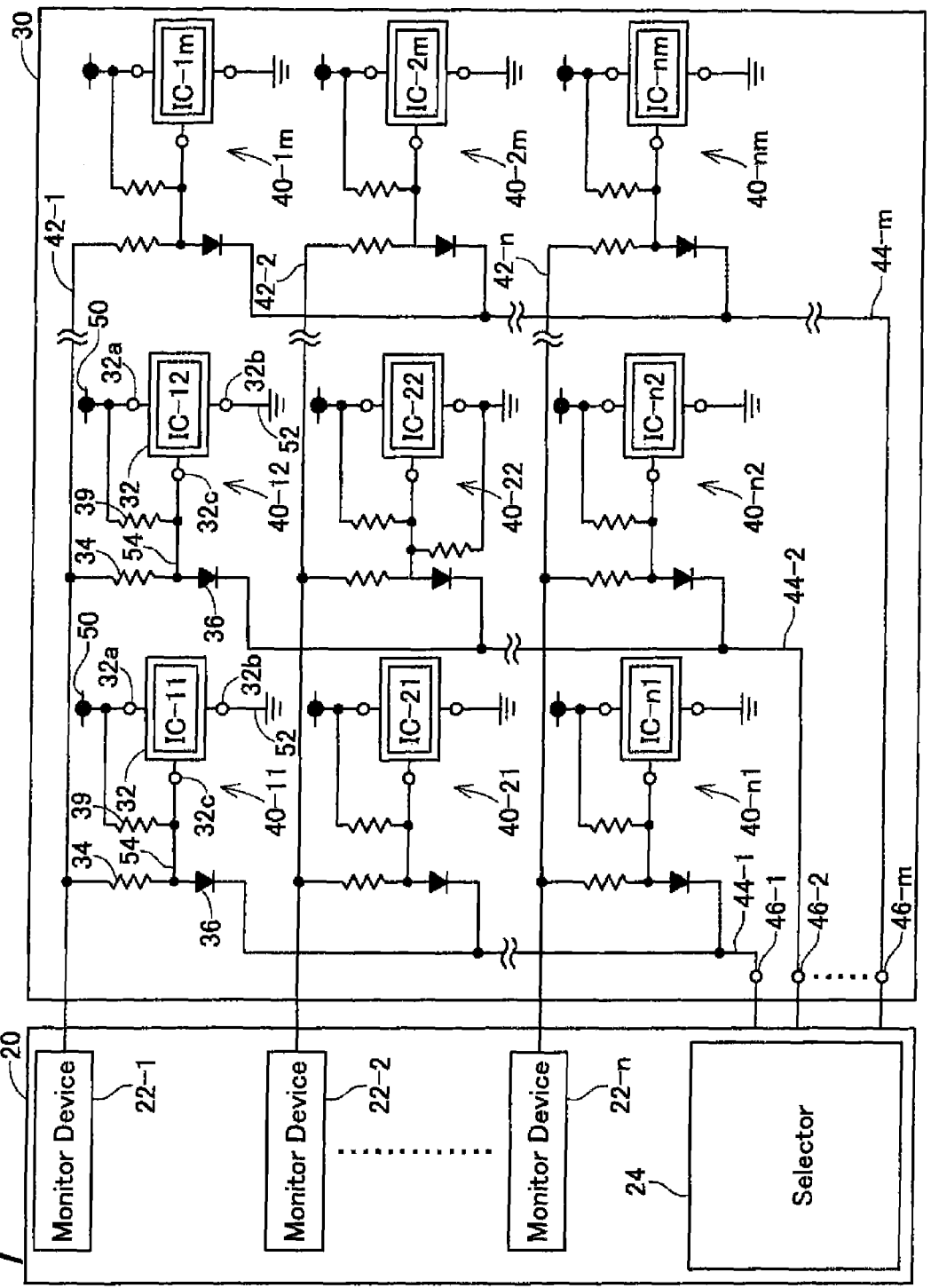
FIG. 7 is a circuit diagram of an inspection system of another embodiment.

FIG. 7 is an embodiment suitable for ICs configured to output the open potential and the ground potential V0. In the embodiment of FIG. 7, a resistor 39 connecting the signal terminal 32c and the power supply wiring 50 is added to each inspection circuit 40, as compared with FIG. 3. In this embodiment, when a selected IC inputs the open potential to the signal terminal 32c, the signal terminal 32c has the power supply potential Vcc because the signal terminal 32c is connected to the power supply wiring 50 via the resistor 39. Therefore, the potential is output to the monitor line 42, similarly to the above-described embodiment. Moreover, when the selected IC outputs the ground potential V0 to the signal terminal 32c, the potential of the monitor line 42 becomes the ground potential V0, similarly to the above-described embodiment. In this manner, according to this configuration, it is possible to suitably inspect the ICs configured to output the open potential and the ground potential V0.

Figure 8:
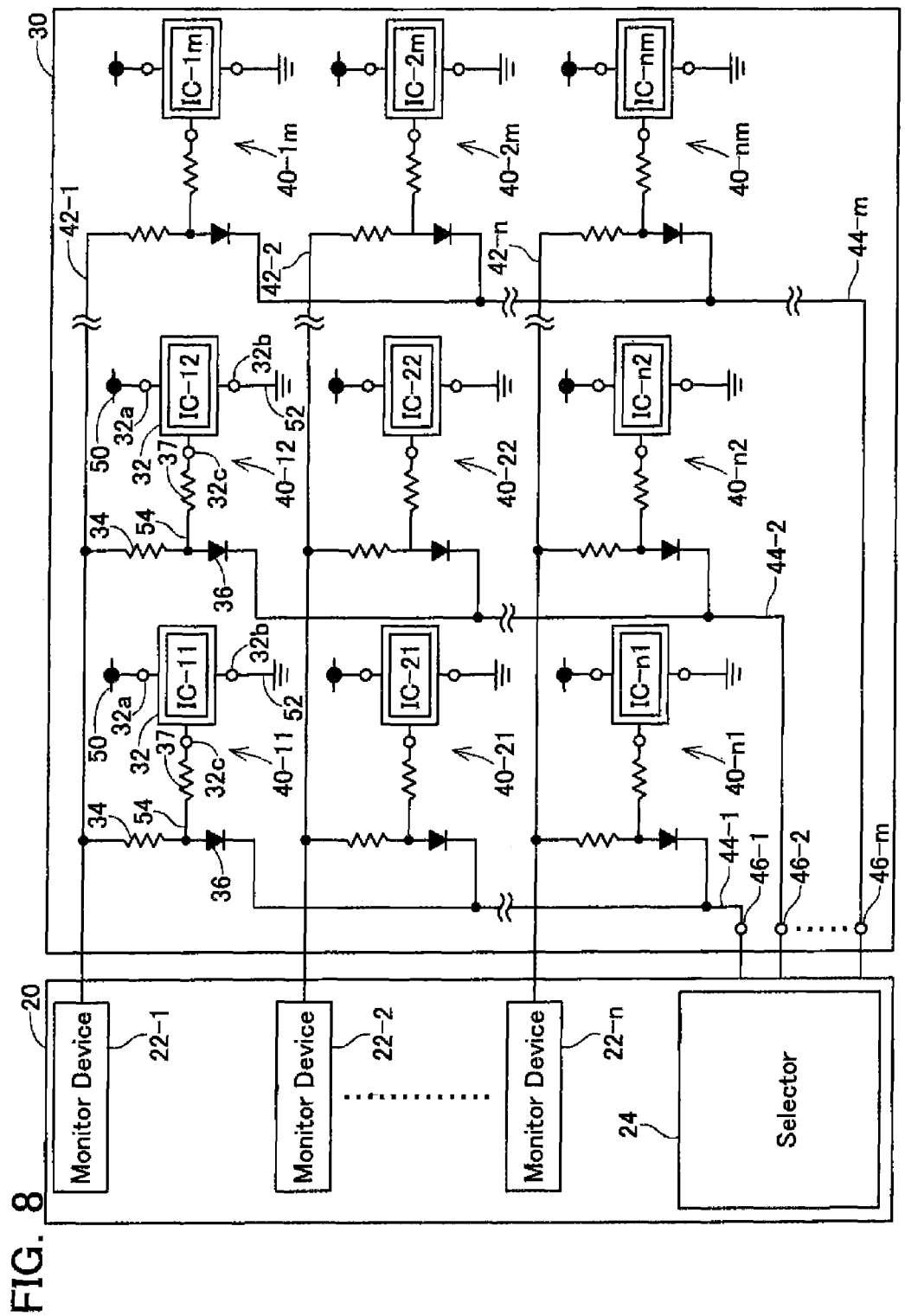
FIG. 8 is a circuit diagram of an inspection system of another embodiment.

Moreover, FIG. 8 is an embodiment in which unselected ICs and diodes 36 can be protected from overcurrent. In the embodiment of FIG. 3, when the terminal 32a on a power supply side and the signal terminal 32c are short-circuited due to a failure of an IC, current flows to the selector line 44 from the power supply wiring 50 via the IC and the diode 36. Since there is no load on this path, the overcurrent might flow cause the IC and/or the diode 36 to be possibly damaged. On the other hand, in a configuration of FIG. 8, a resistor 37 is added between the signal terminal 32 and the diode 36. Therefore, even when a short circuit in the IC occurs, excessively large current can be prevented from flowing therein. It should be noted that the resistor 37 illustrated in FIG. 8 is not necessarily required if an overcurrent protection circuit or the like is formed in the IC.

Figure 9:
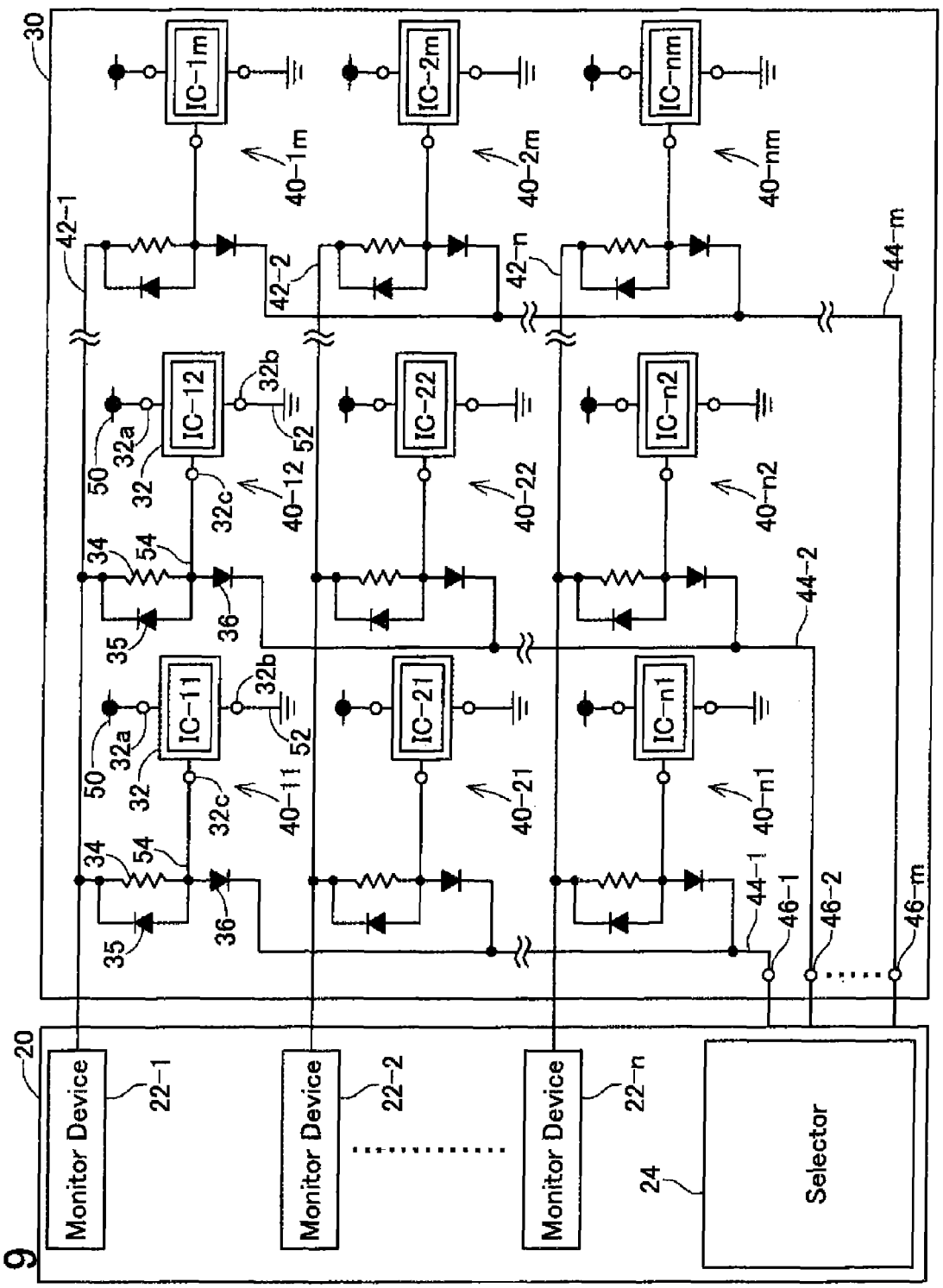
FIG. 9 is a circuit diagram of an inspection system of another embodiment.

Moreover, FIG. 9 is an embodiment in which a diode 35 connected in parallel to the resistor 34 of each inspection circuit 40 is added. The diode 35 is connected so that a cathode of the diode 35 is connected to a side of the monitor line 42. In this embodiment, when the potential of the cathode of the diode 35 (that is, the monitor line 42) is lowered in the unselected inspection circuit 40, the diode 35 is possibly turned on. If the diode 35 is turned on in the unselected inspection circuit 40, the signals are undesirably transmitted from the unselected inspection circuit 40 to the monitor line 42, which leads to a problem. In order to solve this problem, a setting needs to be made such that the diode 36 is turned on earlier than the diode 35 in the unselected inspection circuit 40. As described above, the potential of the monitor line 42 becomes the ground potential V0 when the potential of the monitor line 42 is low. Therefore, the diode 35 of the unselected inspection circuit 40 is turned on when the potential of the signal terminal 32c exceeds V0+VF35 (it should be noted that the potential VF35 is the forward voltage of the diode 35). By contrast, the diode 36 is turned on when the potential of the signal terminal 32c exceeds Vlo+VF36. Therefore, as long as V0+VF35>Vlo+VF36 is satisfied, the diode 36 is turned on earlier than the diode 35 when the potential of the signal terminal 32c of the unselected inspection circuit 40 is increased. In this embodiment, the low potential Vlo is lower than the ground potential V0. Moreover, in this embodiment, the forward voltage VF35 of the diode 35 is substantially equal to the forward voltage VF36 of the diode 36. Therefore, the above-described relationship is satisfied and the signals can be prevented from being transmitted from the unselected inspection circuit 40 to the monitor line 42.

Figure 10:
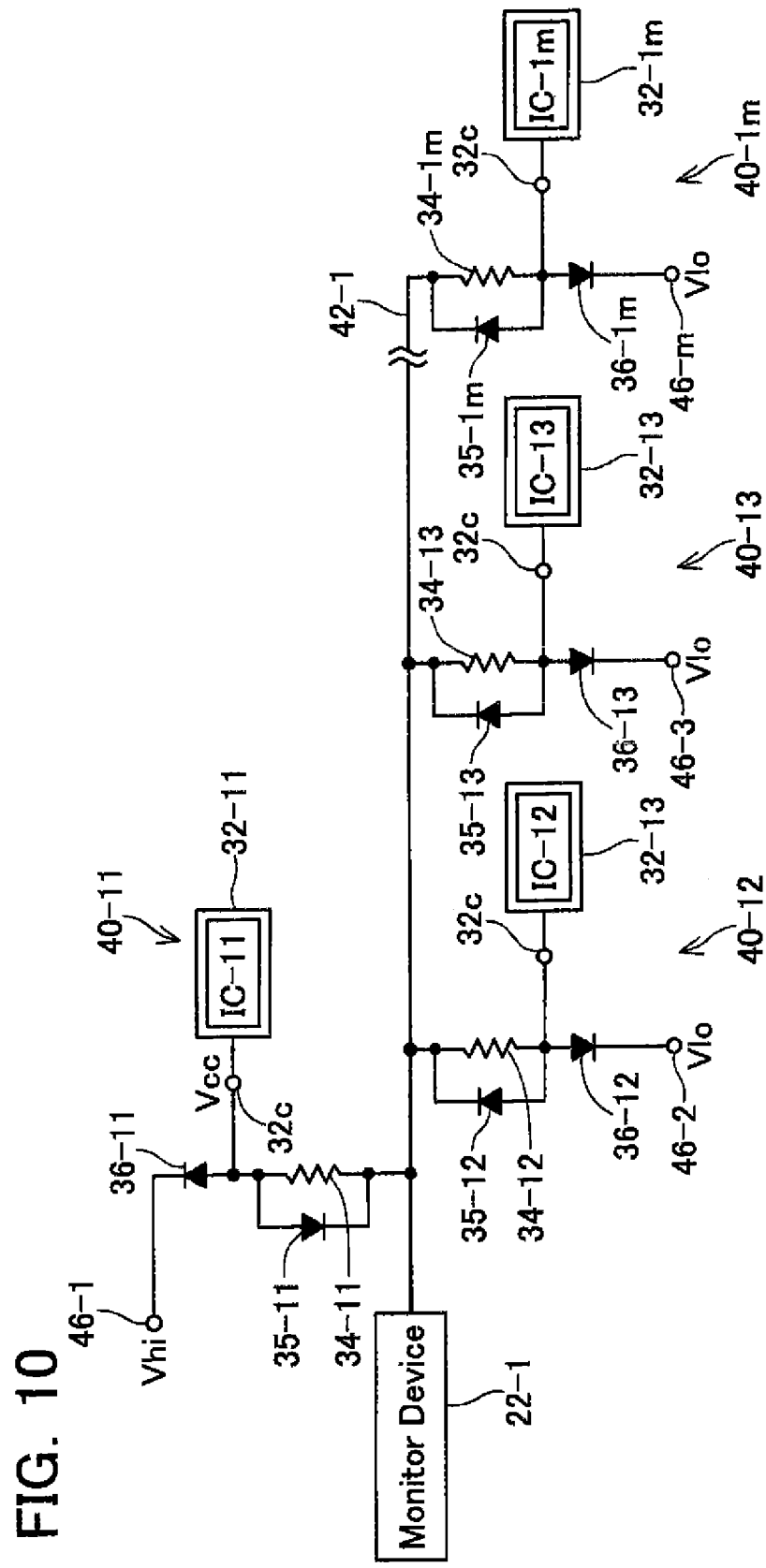
FIG. 10 is an equivalent circuit diagram of a first row part of the inspection system of the embodiment in FIG. 9.

Moreover, FIG. 10 illustrates an equivalent circuit of each inspection circuit 40 connected to the monitor line 42-1 of FIG. 9. When the power supply potential Vcc is applied on the signal terminal 32c of the selected inspection circuit 40, current flows from the signal terminal 32 to the monitor line 42-1 through the diode 35-11. Thus, the potential VM1 of the monitor line 42-1 is:

$$VM1=Vcc-VF35 \qquad \text{[Formula 3]}$$

On the other hand, when the ground potential V0 is applied on the signal terminal 32c of the selected inspection circuit 40, the potential VM2 of the monitor line 42-1 becomes substantially equal to the potential V0, similarly to other above-described embodiments.

The above-described Formula 1 (or Formula 2) is to be herein compared with Formula 3. In the above-described Formula 1 (that is, the embodiment of FIG. 3), a combined resistance RN becomes small as the number of the inspection circuits 40 connected to the monitor line 42-1 is increased. As a result, when the selected IC outputs the power supply potential Vcc, the potential obtained on the monitor line 42-1 is lowered. Thus, an SN ratio of the signal appearing on the monitor line 42-1 is lowered, thereby reducing the inspection accuracy. By contrast, as shown in the above-described Formula 3, the voltage VM1 is not affected by the combined resistance RN in the embodiment of FIGS. 9 and 10. Thus, even if the number of the inspection circuits 40 connected to the monitor line 42-1 is increased, a relatively high potential is obtained on the monitor line 42-1 when the selected IC outputs the power supply potential Vcc. Therefore, the inspection accuracy in this embodiment is high. Moreover, the embodiment of FIGS. 9 and 10 is suitable particularly for a larger-scaled inspection system.

Figure 11:
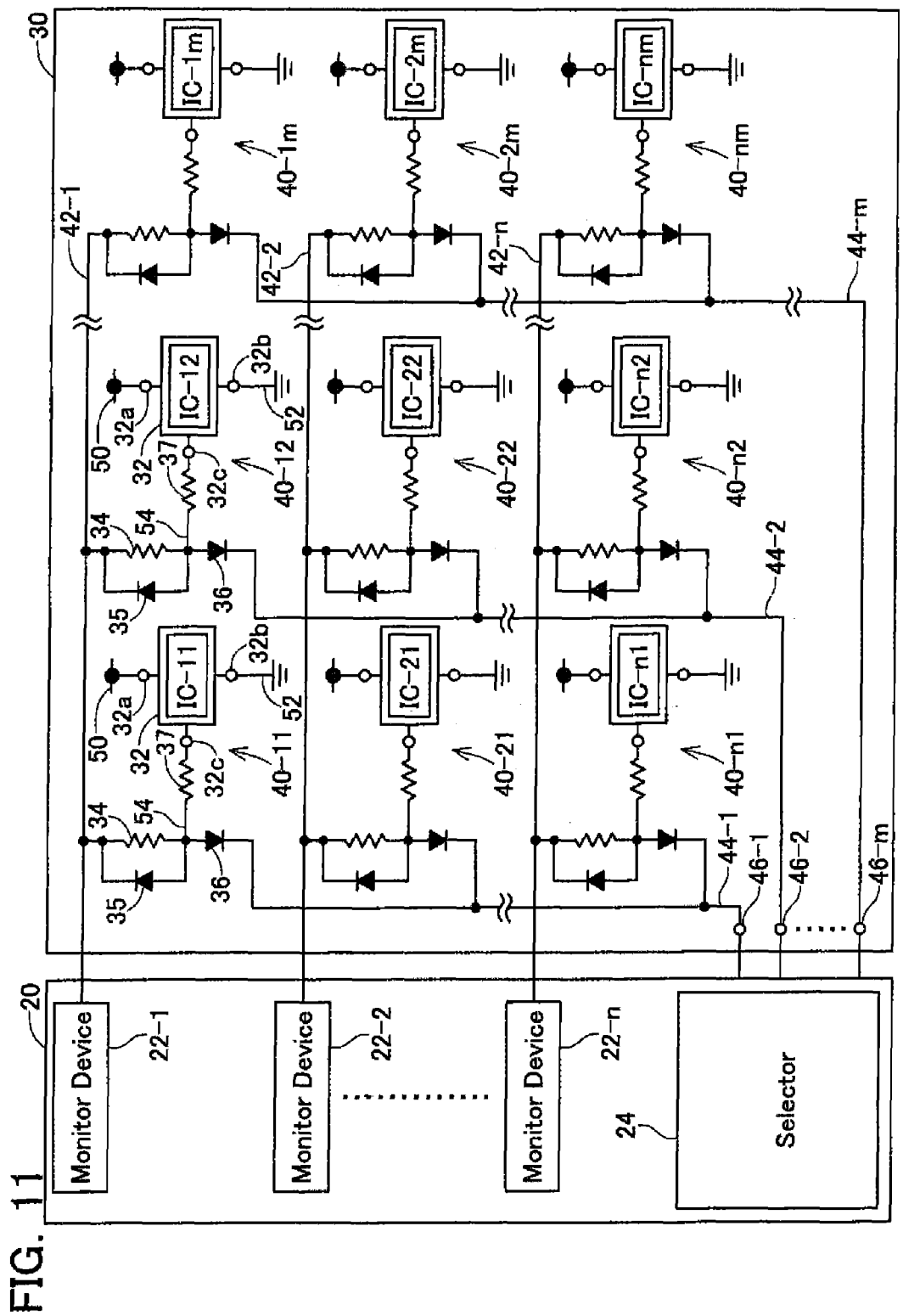
FIG. 11 is a circuit diagram of an inspection system of another embodiment.
Figure 12:
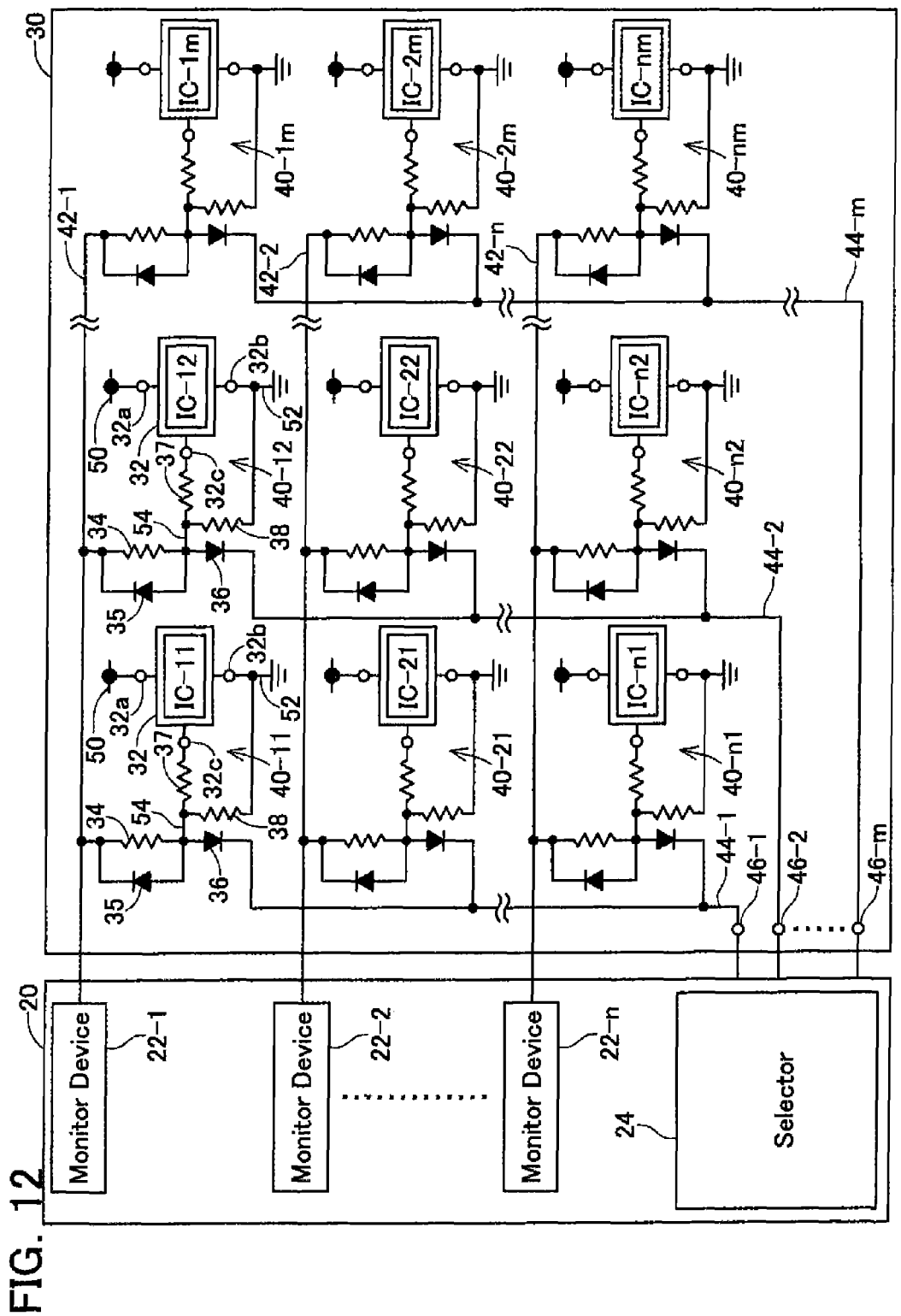
FIG. 12 is a circuit diagram of an inspection system of another embodiment.

Furthermore, FIG. 11 is an embodiment in which the embodiment of FIG. 8 and the embodiment of FIG. 9 are combined. According to this combination, technical effects of both FIG. 8 and FIG. 9 can be obtained. In addition, FIG. 12 is an embodiment in which the embodiment of FIG. 6, the embodiment of FIG. 8 and the embodiment of FIG. 9 are combined. Also with this combination, each of effects of FIGS. 6, 8 and 9 can be obtained. Moreover, each of the embodiments can be also combined in other forms.

Figure 13:
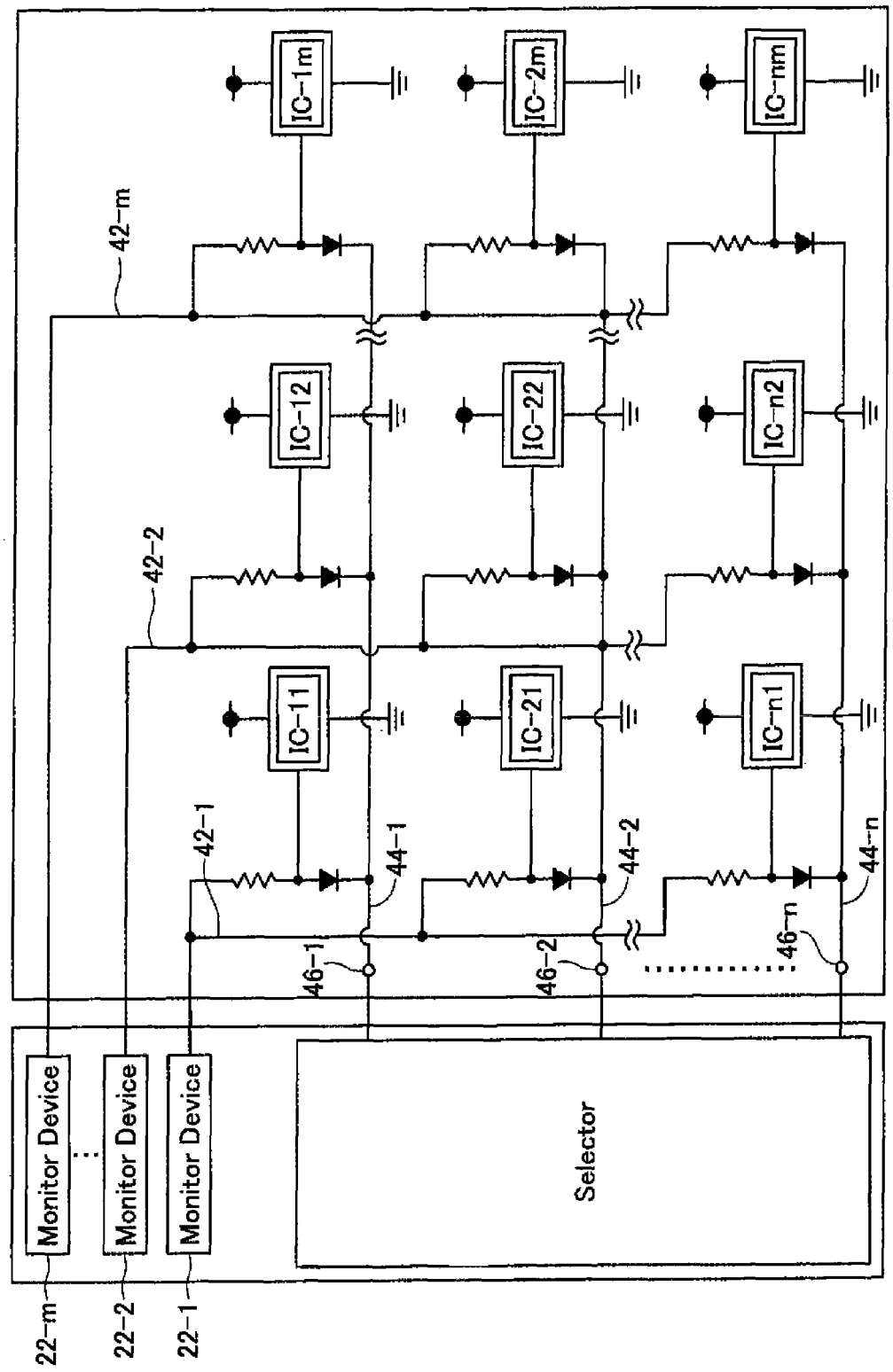
FIG. 13 is a circuit diagram of an inspection system of another embodiment.

In addition, FIG. 13 illustrates a configuration in which the selector lines 44 are extended in the lateral direction and the monitor lines 42 are extended in the vertical direction. A physical arrangement of each component may be changed in this manner.

The embodiments have been described in detail in the above. However, these are only examples and do not limit the claims. The technology described in the claims includes various modifications and changes of the concrete examples represented above.

The technical elements explained in the present description or drawings exert technical utility independently or in combination of some of them, and the combination is not limited to one described in the claims as filed. Moreover, the technology exemplified in the present description or drawings achieves a plurality of objects at the same time, and has technical utility by achieving one of such objects.

The invention claimed is:

1. An inspection apparatus configured to inspect output signals of semiconductor devices, the inspection apparatus comprising:
a monitor line;
a monitor device configured to sense a signal on the monitor line;
a plurality of inspection circuits connected to the monitor line; and
a selector device,
wherein each inspection circuit comprises:
a semiconductor device support on which a semiconductor device is to be set, the semiconductor device support comprising a signal terminal to which a signal is input from the semiconductor device set on the semiconductor support;
a first resistor connected between the signal terminal and the monitor line;
a selector terminal; and
a first diode connected between the signal terminal and the selector terminal so that a cathode of the first diode is connected to a selector terminal side, and
the selector device is configured to perform an operation to apply a first potential on a first selector terminal of the plurality of the selector terminals and apply a second potential lower than the first potential on other selector terminals and an operation to apply the first potential on a second selector terminal of the plurality of the selector terminals and apply the second potential on other selector terminals.

2. The inspection apparatus of claim 1, wherein
V1 is the first potential,
VH1 is an upper potential of the signal input to the signal terminal corresponding to the selector terminal on which the first potential is applied,
VF11 is a forward voltage of the first diode corresponding to the selector terminal on which the first potential is applied,
a relationship of V1>VH1−VF11 is satisfied,
V2 is the second potential,
VH2 is an upper potential of the signal input to the signal terminal corresponding to the selector terminal on which the second potential is applied,
VF12 is a forward voltage of the second diode corresponding to the selector terminal on which the second potential is applied, and
a relationship of V2<VH2−VF12 is satisfied.

3. The inspection apparatus of claim 1, wherein each inspection circuit comprises a second diode connected in parallel to the first resistor so that a cathode of the second diode is connected to a monitor line side.

4. The inspection apparatus of claim 3, wherein
VL1 is a lower potential of the signal input to the signal terminal corresponding to the selector terminal on which the first potential is applied,
V2 is the second potential,
VF12 is a forward voltage of the first diode corresponding to the selector terminal on which the second potential is applied,
VF22 is a forward voltage of the second diode corresponding to the selector terminal on which the second potential is applied, and
a relationship of V2+VF12<VL1+VF22 is satisfied.

5. The inspection apparatus of claim 1, wherein each inspection circuit comprises a second resistor connected between the signal terminal and a connection portion connecting an anode of the first diode and the first resistor.

6. The inspection apparatus of claim 1, wherein
each semiconductor device support comprises:
a high potential terminal providing a high potential to the semiconductor device set on the semiconductor device support; and
a low potential terminal providing a low potential to the semiconductor device set on the semiconductor device support, and
each inspection circuit comprises a third resistor connected between the high potential terminal and the signal terminal.

7. The inspection apparatus of claim 1, wherein
each semiconductor device support comprises:
a high potential terminal providing a high potential to the semiconductor device set on the semiconductor device support; and
a low potential terminal providing a low potential to the semiconductor device set on the semiconductor device support, and
each inspection circuit comprises a fourth resistor connected between the low potential terminal and the signal terminal.

8. An inspection system comprising a plurality of the inspection apparatus of claim 1, wherein
the monitor line and the monitor device of each inspection apparatus are independent, and
the selector terminal of each inspection apparatus is common with the selector terminals of other inspection apparatuses.

9. A method for inspecting output signals of semiconductor devices using an inspection apparatus,
the inspection apparatus comprising:
a monitor line; and
a plurality of inspection circuits connected to the monitor line, wherein each inspection circuit comprises:

a semiconductor device support on which a semiconductor device is to be set, the semiconductor device support comprising a signal terminal to which a signal is input from the semiconductor device set on the semiconductor support;

a first resistor connected between the signal terminal and the monitor line;

a selector terminal; and a first diode connected between the signal terminal and the selector terminal so that a cathode of the first diode is connected to a selector terminal side, the method comprising:

setting a semiconductor device on each semiconductor device support;

sensing a signal on the monitor line in a state where a first potential is applied on a first selector terminal among the plurality of the selector terminals and a second potential lower than the first potential is applied on other selector terminals; and sensing the signal on the monitor line in a state where the first potential is applied on a second selector terminal among the plurality of the selector terminals and the second potential is applied on other selector terminals.

10. A method for manufacturing inspected semiconductor devices, comprising forming structures of semiconductor devices; and inspecting the formed semiconductor devices, wherein an inspection apparatus used in the inspection comprises:

a monitor line, and a plurality of inspection circuits connected to the monitor line, each inspection circuit comprises:

a semiconductor device support on which a semiconductor device is to be set, the semiconductor device support comprising a signal terminal to which a signal is input from the semiconductor device set on the semiconductor support;

a first resistor connected between the signal terminal and the monitor line;

a selector terminal; and a first diode connected between the signal terminal and the selector terminal so that a cathode of the first diode is connected to a selector terminal side, the inspection comprising:

setting a semiconductor device on each semiconductor device support;

sensing a signal on the monitor line in a state where a first potential is applied on a first selector terminal among the plurality of the selector terminals and a second potential lower than the first potential is applied on other selector terminals; and sensing the signal on the monitor line in a state where the first potential is applied on a second selector terminal among the plurality of the selector terminals and the second potential is applied on other selector terminals.

* * * * *